(12) United States Patent
Oh et al.

(10) Patent No.: US 7,696,554 B2
(45) Date of Patent: Apr. 13, 2010

(54) FLASH MEMORY DEVICE

(75) Inventors: Sang Hyun Oh, Anyang-si (KR); Hee Hyun Chang, Seongnam-si (KR); Hee Youl Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 70 days.

(21) Appl. No.: 11/942,227

(22) Filed: Nov. 19, 2007

(65) Prior Publication Data

US 2008/0061353 A1    Mar. 13, 2008

Related U.S. Application Data

(62) Division of application No. 11/297,917, filed on Dec. 9, 2005, now Pat. No. 7,316,955.

(30) Foreign Application Priority Data

Jun. 30, 2005    (KR)    .............................. 2005-57790

(51) Int. Cl.
*H01L 29/94*    (2006.01)

(52) U.S. Cl. .................................. 257/304; 257/E29.3
(58) Field of Classification Search ................. 257/503, 257/296, 298, 304, 305, 311, 314, 315, 316
See application file for complete search history.

(56) References Cited

U.S. PATENT DOCUMENTS 6,831,326 B1 * 12/2004 Hsieh .......................... 257/315
7,250,651 B2 * 7/2007 Kusters et al. ............... 257/315

* cited by examiner

*Primary Examiner*—Zandra Smith
*Assistant Examiner*—Paul E Patton
(74) *Attorney, Agent, or Firm*—Marshall, Gerstein & Borun LLP

(57) ABSTRACT

A flash memory device and method of fabricating the same, wherein a width at the top of a floating gate is narrower than that at the bottom of the floating gate. The area of the floating gate can be reduced while maintaining the overlap area between the control gate and the floating gate. Therefore, inter-cell interference can be reduced without lowering program speed.

10 Claims, 3 Drawing Sheets

FLASH MEMORY DEVICE

CROSS-REFERENCE TO RELATED APPLICATIONS

This is a divisional of U.S. Ser. No. 11/297,917 filed Dec. 9, 2005, which claims the priority of KR 2005-57790 filed Jun. 30, 2005.

BACKGROUND OF THE INVENTION

1. Field of the Invention

The invention relates to a method of fabricating flash memory devices and, more particularly, to flash memory devices and a method of fabricating the same, where inter-cell interference can be reduced without lowering the program speed.

2. Discussion of Related Art

As the level of integration of semiconductor devices increases, isolation films are formed using the Self-Aligned Shallow Trench Isolation (SA-STI) method in the manufacturing process.

The structure of a flash memory cell in which the isolation films is formed by the SA-STI method is described below.

FIG. 1 is a cross-sectional view illustrating a method of fabricating a flash memory cell and the structure thereof in the related art.

Referring to FIG. 1, tunnel oxide films 102, and a first polysilicon layer 103 for forming a floating gate are sequentially formed on a semiconductor substrate 101. The first polysilicon layer 103 and the tunnel oxide films 102 are patterned by the SA-STI method, forming isolation films 104 in the isolation regions.

If the isolation films 104 are formed by the SA-STI method as described above, the tunnel oxide films 102 and the first polysilicon layer 103 remain on the active regions between the projections of the isolation films 104 while the top surfaces of the isolation films 104 project higher than the semiconductor substrate 101.

A second polysilicon layer 105 for forming a floating gate is then formed on the entire surface. The second polysilicon layer 105 on the isolation films 104 is then partially removed by an etch process so that it is patterned in a direction vertical to the line. At this time, since some of the second polysilicon layer 105 on the isolation films 104 is removed, the edges of the second polysilicon layer 105 overlap with the isolation films 104 (indicated by "A" in FIG. 1). A floating gate 106 having first and second polysilicon layers 103, 105 is thereby completed.

Thereafter, an interlayer dielectric film 107 of an Oxide-Nitride-Oxide (ONO) structure and a polysilicon layer 108 for a control gate are formed on the entire surface. A tungsten silicide layer (not shown) for lowering surface resistance is formed on the polysilicon layer 108 for the control gate. The tungsten silicide layer, the polysilicon layer 108 for the control gate, the interlayer dielectric film 107 and the floating gate 106 are patterned by a photolithography process, forming a gate. A subsequent process is then performed to complete the fabrication of the flash memory device.

The flash memory cell is a device that stores and reads information through the migration of the threshold voltage in a state where electrons are injected into the floating gate and a state where electrons are not injected into the floating gate. The program speed is proportional to an overlap area between the control gate and the floating gate, i.e., the coupling ratio.

Meanwhile, inter-cell interference in which the threshold voltage is influenced depending on the state of peripheral cells becomes great as the area of the floating gate becomes wide.

In the inter-cell interference phenomenon, the threshold voltage of the program cell is varied depending on whether peripheral cells have been programmed. As a result, as the cell distribution is widened that much, the characteristics and uniformity of the device are degraded.

If the area of the second polysilicon layer 105 is wide as in the related art, the cell distribution is increased due to inter-cell interference. If the width of the second polysilicon layer 105 is reduced in order to reduce the cell distribution, problems arise because the coupling ratio is reduced and the program speed is lowered.

SUMMARY OF THE INVENTION

The invention provides flash memory devices and methods of fabricating the same, in which the area of a floating gate, which causes an increase in inter-cell interference, can be reduced while maintaining an overlap area between the floating gate and the control gate, which determines the program speed, without change.

The invention also provides flash memory devices and method of fabricating the same, in which cell distribution can be reduced without lowering the program speed, thus improving device characteristics and uniformity.

A flash memory device according to one aspect of the invention includes a semiconductor substrate in which a field region and an active region are defined, isolation films that are formed in a semiconductor substrate of the field region as a shallow trench isolation structure, tunnel oxide films on the semiconductor substrate of the active region, a floating gate formed on the tunnel oxide films, wherein a width at the top of the floating gate is narrower than a width at the bottom of the floating gate, an interlayer dielectric film formed along a surface step of the semiconductor substrate including the floating gate, and a control gate formed on the interlayer dielectric film.

A method of fabricating a flash memory device according to another aspect of the invention includes the steps of (a) forming tunnel oxide films, a first polysilicon layer and a sacrificial film on a semiconductor substrate in which an active region and a field region are defined, (b) etching the sacrificial film, the first polysilicon layer, the tunnel oxide films and the semiconductor substrate of the field region to form trenches, and forming isolation films within the trenches, (c) removing the sacrificial film to expose upper sides of the isolation films, (d) forming insulating sidewalls on the sides of the exposed isolation films, (e) filling the portions from which the sacrificial film is removed with a second polysilicon layer, (f) removing the isolation films and the insulating sidewalls to expose the second polysilicon layer, (g) rounding edge portions of the second polysilicon layer and mitigating a negative profile having the second polysilicon layer, and (h) sequentially forming an interlayer dielectric film and a control gate on the entire surface.

DETAILED DESCRIPTION OF PREFERRED EMBODIMENTS

The invention is described below in connection with preferred embodiments with reference to the accompanying drawings.

Figure 1:
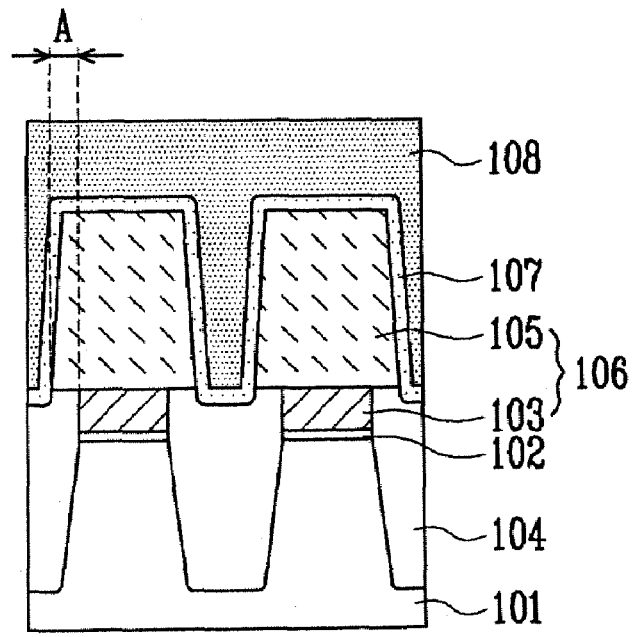
FIG. 1 is a cross-sectional view illustrating a method of fabricating a flash memory cell and the structure thereof in the related art.
Figure 2:
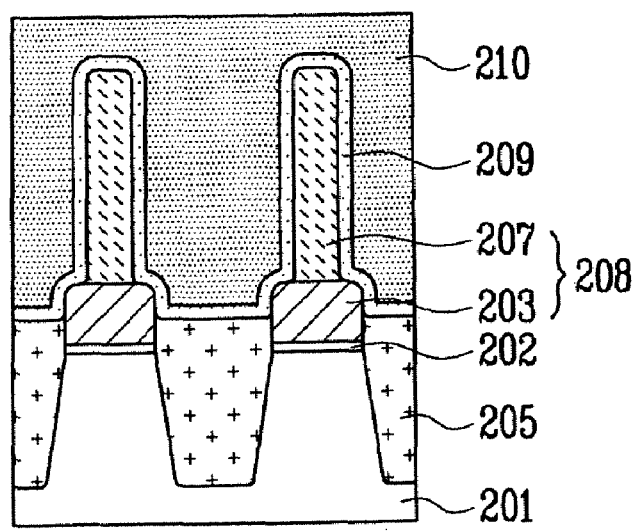
FIG. 2 is a cross-sectional view of a flash memory device according to an embodiment of the invention.

FIG. 2 is a cross-sectional view of a flash memory device according to an embodiment of the invention.

As shown in FIG. 2, in the flash memory device of the invention, isolation films 205 having a shallow trench structure are formed in the field region of a semiconductor substrate 201 in which the field region and the active region are defined. Tunnel oxide films 202 are formed on the semiconductor substrate 201 of the active region. A floating gate 208 in which a bottom width is narrower than a top width is formed on the tunnel oxide films 202.

The floating gate 208 is a stack film of a first polysilicon layer 203 and a second polysilicon layer 207. The first and second polysilicon layers 203, 207 are formed only on the active region and do not overlap with the isolation films 205. Furthermore, the second polysilicon layer 207 has a width narrower than that of the first polysilicon layer 203.

Meanwhile, a top surface of the isolation films 205 is projected higher than that of the semiconductor substrate 201 by a predetermined thickness. A top surface of the first polysilicon layer 203 is projected higher than that of the isolation films 205 by a predetermined thickness.

Furthermore, an interlayer dielectric film 209 of an ONO structure is formed on the entire surface including the floating gate 208 along the surface step. A third polysilicon layer 210 for a control gate is formed on the interlayer dielectric film 209.

A method of fabricating the flash memory device constructed above according to the invention will be described below.

FIGS. 3A to 3F are cross-sectional views illustrating a method of fabricating a flash memory device according to an embodiment of the invention.

Figure 3A:
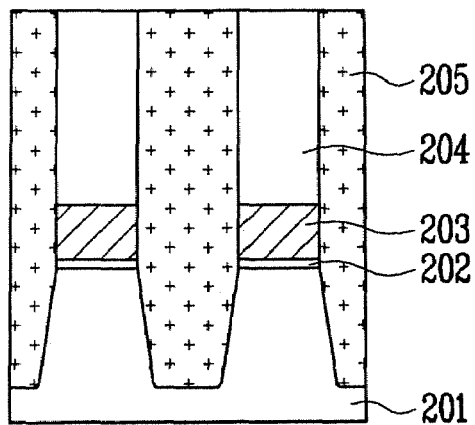
FIGS. 3A to 3F are cross-sectional views illustrating a method of fabricating a flash memory device according to an embodiment of the invention.

To fabricate the flash memory device according to the invention, as shown in FIG. 3A, the tunnel oxide films 202, the first polysilicon layer 203 for the floating gate, and the sacrificial film 204 are sequentially formed on the semiconductor substrate 201 having the field region and the active region. The sacrificial film 204, the first polysilicon layer 203, the tunnel oxide films 202 and the semiconductor substrate 201 of the field region are etched, preferably by a photolithography process, forming trenches.

The sacrificial film 204 can be formed using a nitride film.

A sidewall oxide film (not shown) is formed on the semiconductor substrate 201 in which the trenches are formed by means of a sidewall oxidization process. After an oxide film is deposited on the entire surface so that the trenches are fully buried, a polishing process is performed on the oxide film using the sacrificial film 204 as a target, forming the isolation films 205 within the trenches. The polishing process can be performed using a Chemical Mechanical Polishing (CMP) process or etch back process.

Figure 3B:
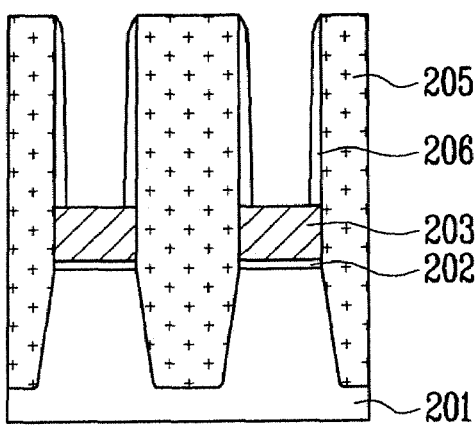

As shown in FIG. 3B, the sacrificial film 204 is removed by a wet etch process to expose upper sides of the isolation films 205. A spacer insulating film is deposited on the entire surface and is then blanket-etched to form insulating sidewalls 206 on the sides of the exposed isolation films 205.

The spacer insulating film can be formed using either a silicon oxide film or a silicon nitride film. The silicon oxide film can include High Temperature Oxide (HTO), a Tetra Ethyl Ortho Silicate (TEOS) oxide film or a High temperature Low pressure Deposition (HLD) oxide film. Furthermore, the silicon oxide film and the silicon nitride film can be formed using one of Low Pressure Chemical Vapor Deposition (LPCVD), Atmospheric Pressure Chemical Vapor Deposition (APCVD), Plasma-Enhanced Chemical Vapor Deposition (PECVD).

Figure 3C:
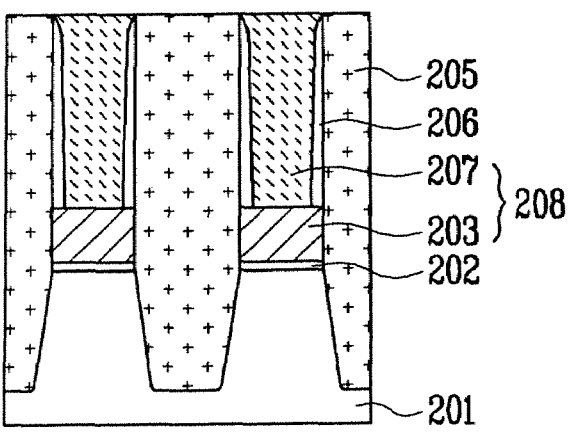

Thereafter, as shown in FIG. 3C, the second polysilicon layer 207 for the floating gate is deposited on the entire surface so that the portions from which the sacrificial film 204 is removed are fully filled. The second polysilicon layer 207 is polished to expose the isolation films 205. The polishing process can be carried out using CMP.

The floating gate 208 consisting of the stack film of the first and second polysilicon layers 203, 207 is thereby completed. This floating gate structure is called a Profiled Self-Aligned floating Gate (PSAG) structure.

Figure 3D:
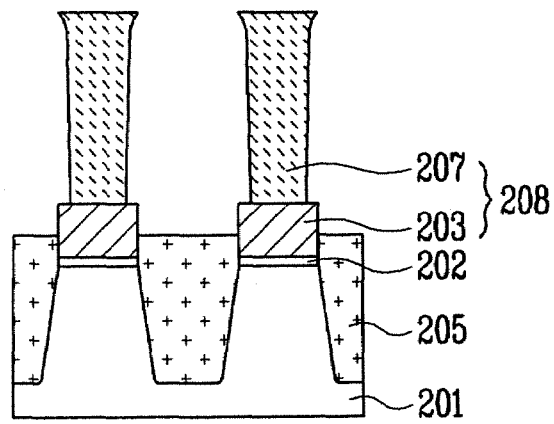

As shown in FIG. 3D, the insulating sidewalls 206 are removed while recessing the isolation films 205 using a wet etch process so that the Effective Field Height (EFH) of the isolation films 205 becomes lower than the top height of the first polysilicon layer 203.

As a result of the process, the second polysilicon layer 207 having a negative profile in which edge portions have a pointed shape and a width at the top is wider than a width at the bottom is exposed.

In this state, if the interlayer dielectric film is formed, the leakage current is generated in the interlayer dielectric film under the influence of the pointed edge portions of the second polysilicon layer 207. The negative profile of the second polysilicon layer 207 may become a burden on a subsequent gate etch process.

Figure 3E:
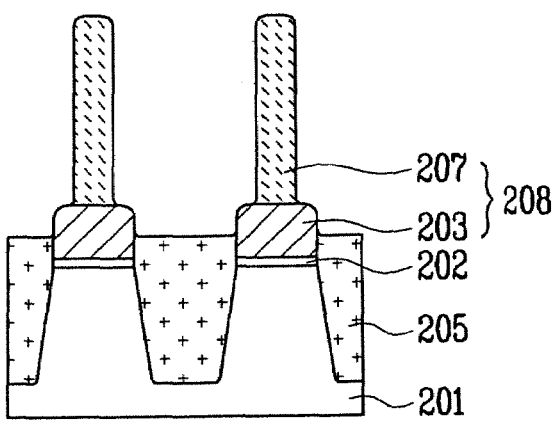

To solve the problem, the edge portions of the second polysilicon layer 207 are rounded and the negative profile of the second polysilicon layer 207 are also rounded by performing a plasma-treated isotropic etch process, as shown in FIG. 3E.

Figure 3F:
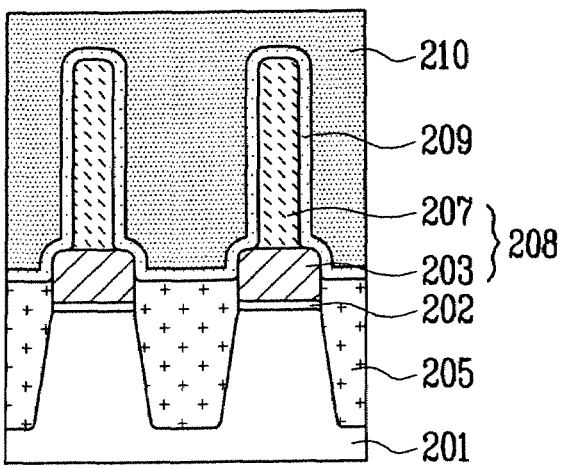

Thereafter, as shown in FIG. 3F, an ONO film is deposited on the entire surface along the surface step. The interlayer dielectric film 209 is then formed. The third polysilicon layer 210 for the control gate is formed on the interlayer dielectric film 209.

Thereafter, though not shown in the drawings, the third polysilicon layer 210, the interlayer dielectric film 209 and the floating gate 208 are etched through a photolithography process, forming the gate. A subsequent process is performed to complete the fabrication of the flash memory device.

The invention has the following advantages.

First, the area of the floating gate can be reduced while maintaining the overlap area between the control gate and the floating gate. It is thus possible to reduce inter-cell interference without lowering the program speed.

Second, since inter-cell interference can be reduced, cell distribution can be reduced.

Third, since cell distribution can be reduced, Multi-Level Cells (MLC) requiring small cell distribution can be easily facilitated.

Although the foregoing description has been made with reference to the preferred embodiments, it is to be understood that changes and modifications of the invention may be made by the ordinary skilled in the art without departing from the spirit and scope of the invention and appended claims.

What is claimed is:

1. A flash memory device comprising:
a semiconductor substrate defining a field region and an active region;
isolation films formed in the semiconductor substrate in the field region;
tunnel oxide films over the semiconductor substrate of the active region;
a first floating gate formed over the tunnel oxide films and a second floating gate formed on the first floating gate wherein a width of the second floating gate is narrower than the width of the first floating gate;
an interlayer dielectric film formed along a surface step of the semiconductor substrate including sidewalls of the floating gates; and
a control gate formed on the interlayer dielectric film.

2. The flash memory device of claim 1, wherein the first and the second floating gates comprise polysilicon.

3. The flash memory device of claim 1, wherein a top edge of the first floating gate has a round shape.

4. The flash memory device of the claim 1, wherein a top edge of the second floating gate has a round shape.

5. The flash memory device of the claim 1, wherein a top edge of each of the first floating gate and the second floating gate has a round shape.

6. The flash memory device of the claim 1, wherein the dielectric film is formed along a surface of the first and second floating gates.

7. A flash memory device comprising:
a semiconductor substrate defining a field region and an active region;
isolation films formed in the semiconductor substrate in the field region;
tunnel oxide films over the semiconductor substrate of the active region;
a first floating gate formed on the tunnel oxide films;
a second floating gate formed on the first floating gate wherein a width of the second floating gate is narrower than that of the first floating gate;
an interlayer dielectric film formed along a surface of the first and the second floating gate;
a control gate formed on the interlayer dielectric film.

8. A flash memory device of claim 7, wherein the first and the second floating gates comprise polysilicon.

9. A flash memory device of claim 7, wherein a top edge of the second floating gate has a round shape.

10. A flash memory device of claim 7, wherein a top edge of each of the first and second floating gates has a round shape.

* * * * *